US006626262B1

(12) United States Patent
Chen

(10) Patent No.: US 6,626,262 B1
(45) Date of Patent: Sep. 30, 2003

(54) WATERPROOF SPEAKER

(76) Inventor: Ting-Pang Chen, 2 Fl., No. 12, Lane 31, Shui-Yuan Rd., Taipei (TW)

( * ) Notice: Subject to any disclaimer, the term of this patent is extended or adjusted under 35 U.S.C. 154(b) by 0 days.

(21) Appl. No.: 10/212,122

(22) Filed: Aug. 6, 2002

(51) Int. Cl.[7] .................................................. H05K 5/00

(52) U.S. Cl. ........................ 181/149; 181/166; 381/189; 381/404

(58) Field of Search ................................. 181/149, 166, 181/150, 151, 171, 172; 381/386, 189, 153, 392, 395, 404, 413

(56) References Cited

U.S. PATENT DOCUMENTS 4,239,944 A * 12/1980 Obara et al. ................ 181/171
5,008,945 A * 4/1991 Murayama et al. ......... 381/409
5,408,056 A * 4/1995 Thomas ...................... 181/171
5,776,597 A * 7/1998 Watanabe et al. ........ 428/297.4
5,878,150 A * 3/1999 Okazaki et al. ............ 181/166
6,128,394 A * 10/2000 Hayakawa et al. ......... 381/386
6,438,246 B1 * 8/2002 Kim ........................... 381/337

FOREIGN PATENT DOCUMENTS

JP 55135499 A * 10/1980 ............ H04R/9/02
JP 04340898 A * 11/1992 ............ H04R/9/02
JP 2000184494 A * 6/2000 ............ H04R/9/04

* cited by examiner

*Primary Examiner*—Robert E. Nappi
*Assistant Examiner*—Edgardo San Martin
(74) *Attorney, Agent, or Firm*—Venable LLP; Fei-Fei Chao

(57) ABSTRACT

A waterproof speaker has a yoke provided with a magnet and a center pole therein. A top plate is attached on the periphery of the yoke, wherein the center pole protrudes through a center opening of the top plate. A frame is mounted on a front surface of the top plate. A cone-shaped diaphragm has a middle through-hole that mounts a bobbin and is enclosed by a cap, wherein the diaphragm has its rim portion attached to a forward end portion of the frame via an edge portion. A voice coil is mounted around the periphery of the bobbin. A waterproof damper is supported by the frame and defined with a hole through which the bobbin is protruded, and the damper is formed of two layers, wherein a first layer is cloth material, and a second layer is waterproof material to prevent moisture entering the yoke.

2 Claims, 4 Drawing Sheets

WATERPROOF SPEAKER

BACKGROUND OF THE INVENTION

1. Field of Invention

The present invention relates to a waterproof speaker, and more particularly to a speaker with a damper that is formed with a waterproof layer to prevent moisture entering the speaker.

2. Related Art

The components of a speaker mainly include a magnet, a yoke, a damper, a voice coil and a cone. In-the manufacture process of the speaker, the waterproof and dust-proof requirements are essential since the use life of the speaker is determined by those important factors.

With reference to FIG. 4, a conventional speaker device is composed of a yoke (50) with a bottom at which a center pole (52) is protruded forward. A ring-shaped magnet provided inside the yoke (50) has a center aperture into which the center pole (52) is inserted. A top plate (54) defined with a center opening (541) is securely attached on the periphery of the yoke (50), wherein the center opening (541) allows the center pole (52) to insert therethrough. On the front surface of the top plate (54) is mounted a frame (57) supporting a cone-shaped diaphragm (56). At a middle portion-of the diaphragm (56) is mounted a bobbin (58) that extends through the center opening (541) of the top plate (54). A voice coil (53) is mounted around the outer periphery of the bobbin (58). The diaphragm (56) has a mid through-hole, mounting the bobbin (58), and the diaphragm (56) is closed by a cap (561). The diaphragm (56) has its rim portion attached to the forward end portion of the frame (57) via an edge portion. A damper (55) defined with a hole (not numbered) through which the bobbin (58) is protruded is supported by the frame (57).

The conventional damper (55) is formed of a cloth material, therefore moisture easily enters the inside chamber of the speaker through the fiber of the cloth. When the speaker is used for a long term, the element disposed inside which, such as the voice coil (53), may incur possible damage from the moisture.

To overcome the shortcomings, a waterproof speaker in accordance with the present invention obviates or mitigates the aforementioned drawbacks.

SUMMARY OF THE INVENTION

The main objective of the present invention is to provide a waterproof speaker to prolong the use life of the speaker.

To achieve the objective, the speaker utilizes a waterproof damper to provide reliable performance from the speaker. The waterproof damper is composed of two layers, one of which is made of the cloth material, and the other of which is made of a waterproof material, such as rubber. Through the use of the double layered damper, all elements inside the speaker are isolated from the external moisture.

Other objectives, advantages and novel features of the invention will become more apparent from the following detailed description when taken in conjunction with the accompanying drawings.

DETAILED DESCRIPTION OF THE INVENTION

Figure 1:
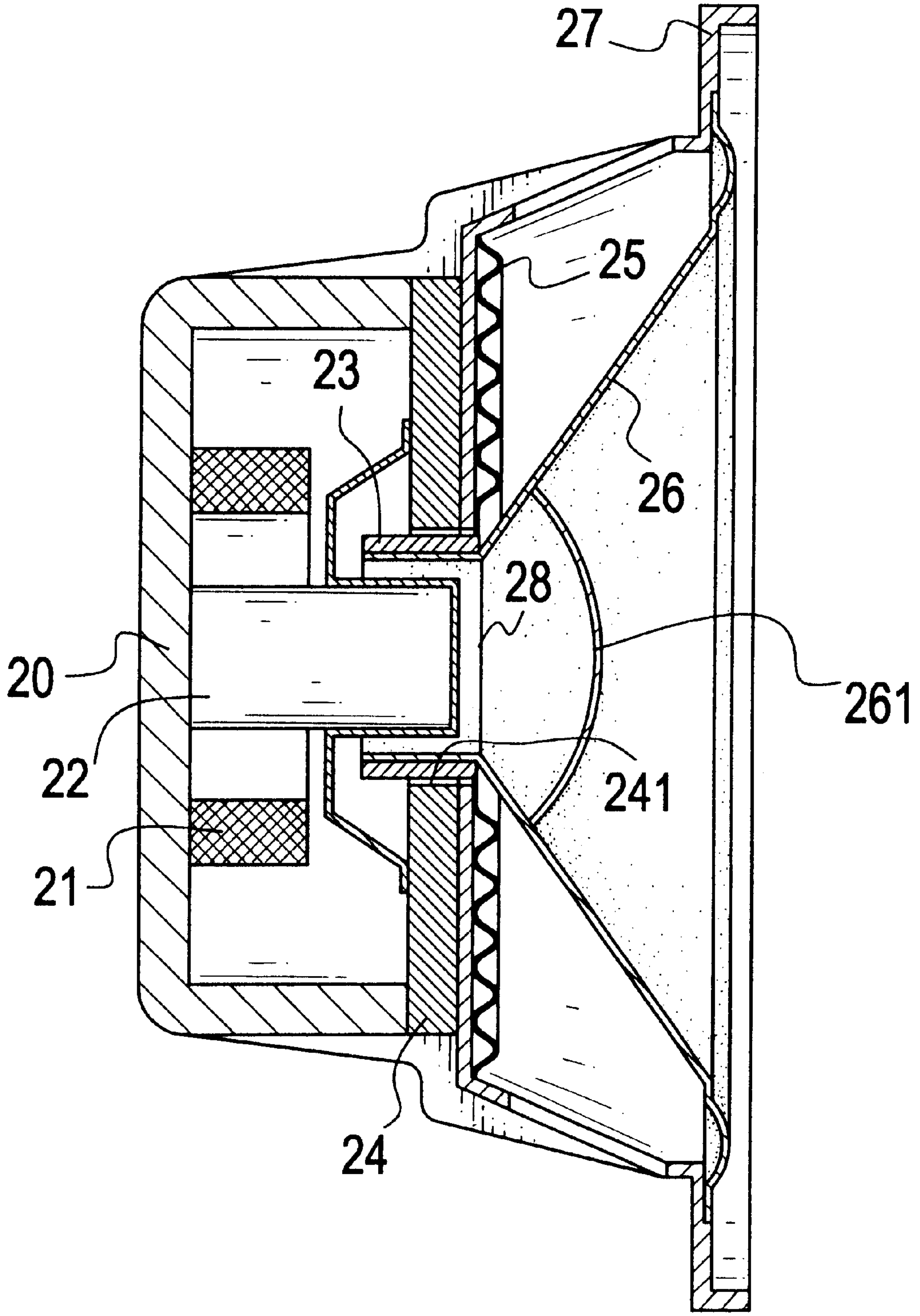
FIG. 1 is a cross-section view of a waterproof speaker in accordance with the present invention.

With reference to FIG. 1, a waterproof speaker in accordance with the present invention comprises a yoke (20) having a chamber inside which a ring-shaped magnet (21) is retained. A center pole (22) is attached at a center portion of the bottom of the chamber and protrudes through a through hole of the magnet (21). A top plate (24) defined with a center opening (241) is securely attached on the periphery of the yoke (20), wherein the center opening (241) allows the center pole (22) to insert therethrough. On the front surface of the top plate (24) is mounted a frame (27) that supports a cone-shaped diaphragm (26). A middle portion of the diaphragm (26) is mounted with a bobbin (28) that extends through the center opening (241) of the top plate (24) and supports via the diaphragm (26). A voice coil (23) is mounted around the outer periphery of the bobbin (28). The diaphragm (26) has a middle through-hole, mounting the bobbin (28), and the through hole is closed with a cap (261). The cap (261) encloses the voice coil (23), the center pole (22) and the bobbin (28) inside the speaker. The diaphragm (26) has its rim portion attached to the forward end portion of the frame (27) via an edge portion. A waterproof damper (25) is defined with a hole (not numbered) through which the bobbin (28) is protruded, and the waterproof damper (25) is supported by the frame (27).

Figure 2:
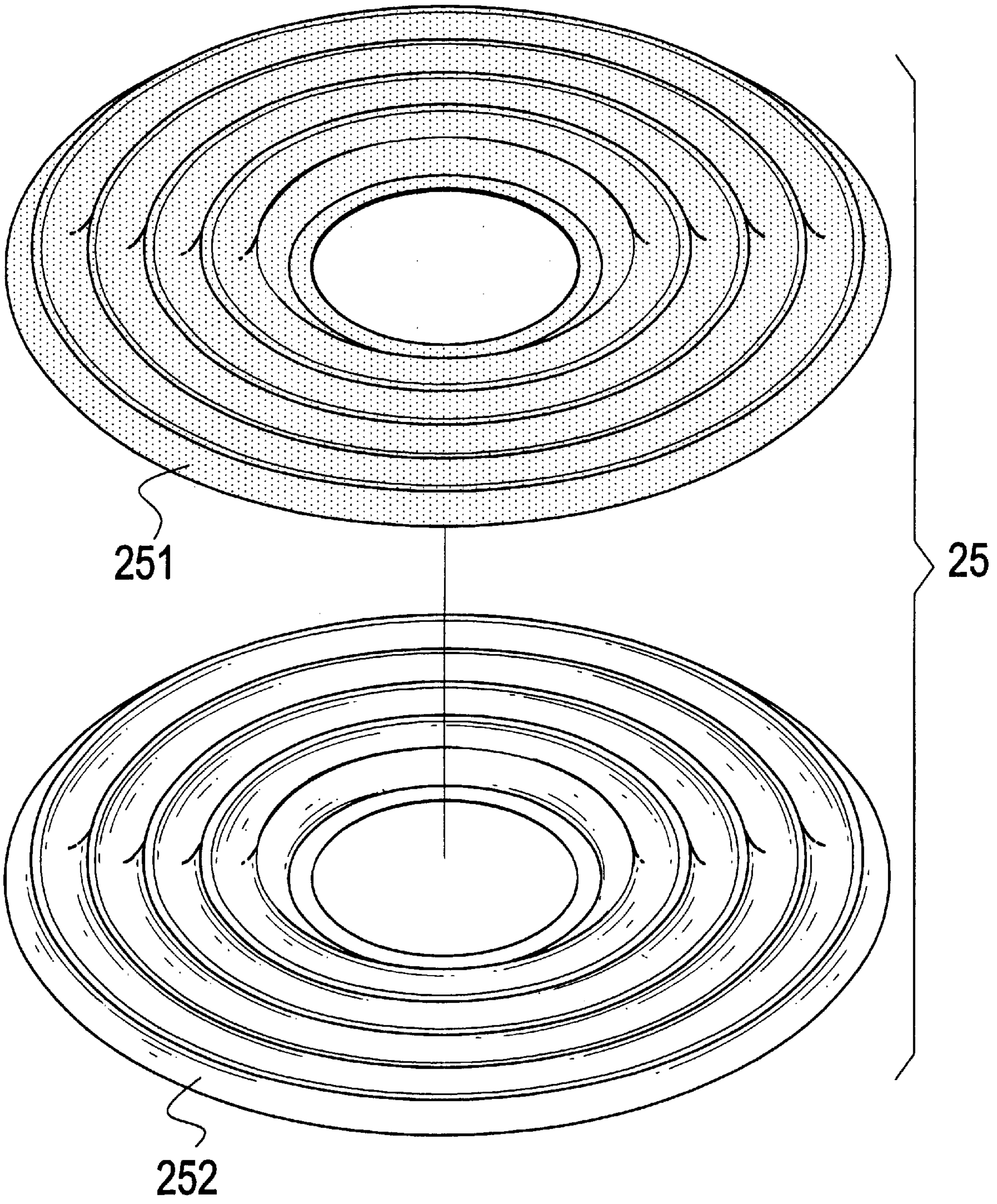
FIG. 2 is an exploded view of a damper in accordance with the present invention.
Figure 3:
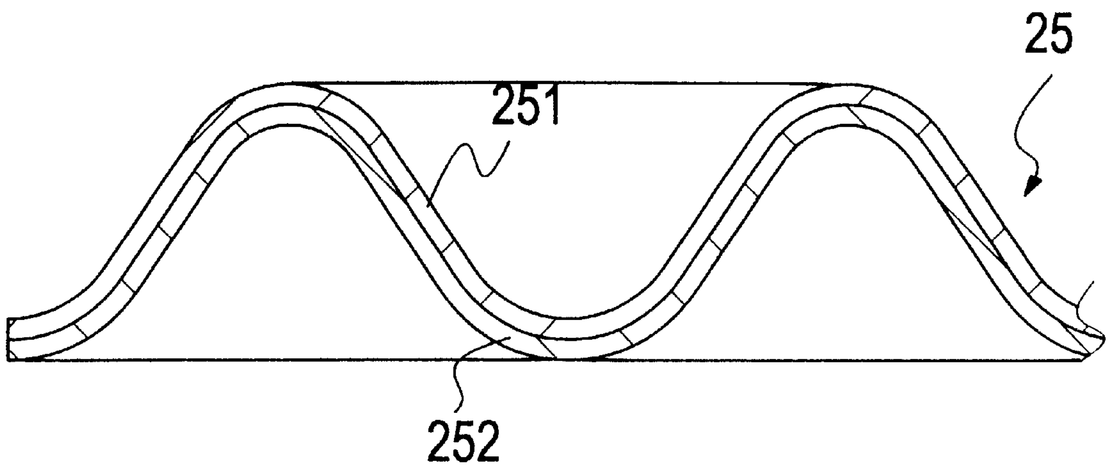
FIG. 3 is a cross-section view of the damper of FIG. 2.
Figure 4:
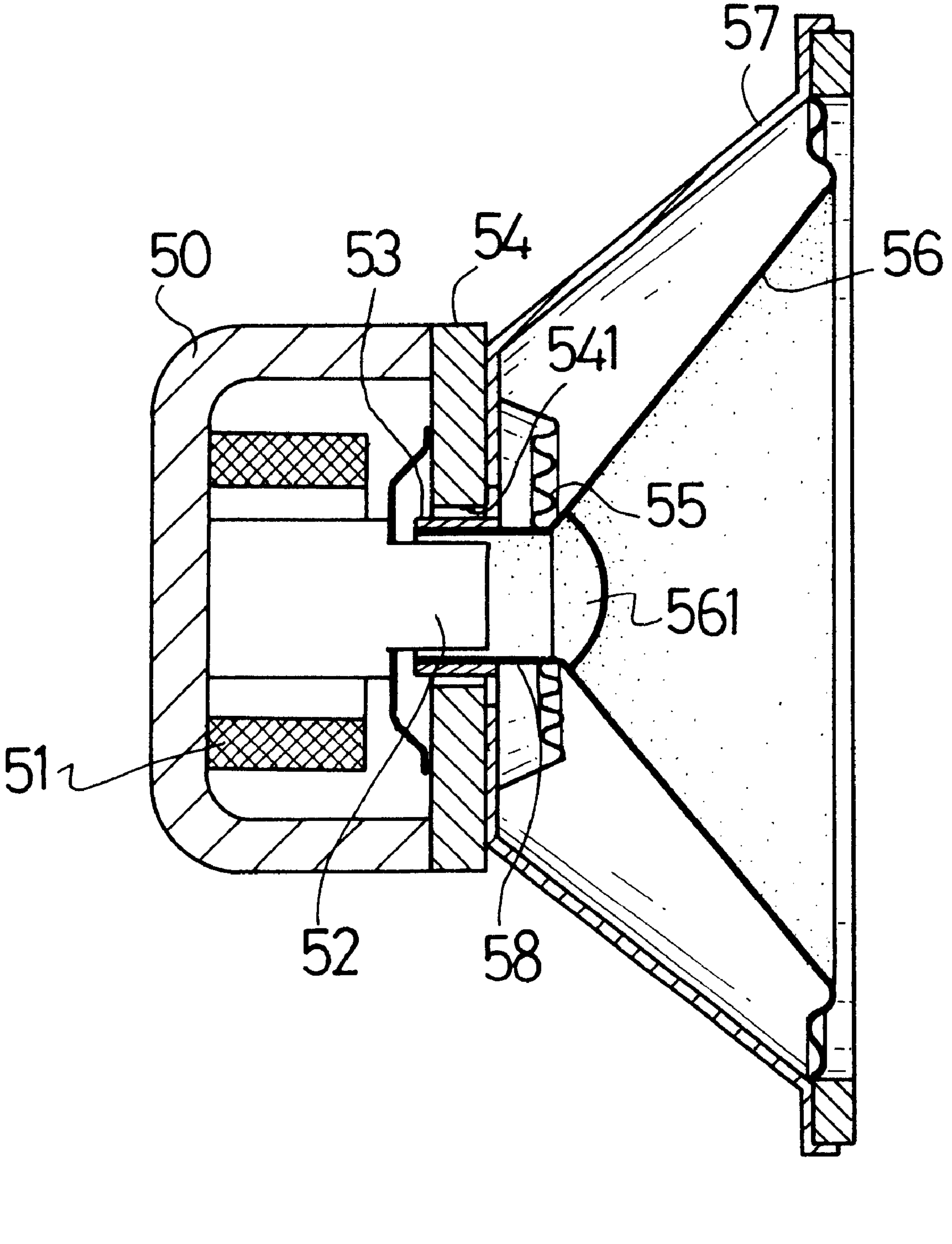
FIG. 4 PRIOR ART
FIG. 4 is a cross-section view of a conventional speaker.

With reference to FIGS. 2 and 3, the waterproof damper (25) is composed of two layers with different materials. A first layer (251) of the damper (25) is made of a cloth material, and a second layer (252) is used as a waterproof layer. The second layer (252) can be attached to the first layer (251) with adhesive or a thermo-press process etc. The preferable thickness ratio of the first layer (251) to the second layer (252) is approximately 4:1. The waterproof material of the second layer (252) can be chosen from a thin rubber slice, a thermoplastic material or any material capable of waterproofing.

After the first layer (251) is combined with the second layer (252) to form the waterproof damper (25), the damper (25) effectively prevents external moisture entering the chamber of the speaker. Since the possible damage to the elements inside the speaker is avoided, the use-life of the speaker is prolonged.

The invention may be varied in many ways by a skilled person in the art. Such variations. are not to be regarded as a departure from the spirit and scope of the invention, and all such modifications are intended to be included within the scope of the following claims.

What is claimed is:

1. A waterproof speaker comprising a yoke inside which a ring-shaped magnet that defines a through hole is retained, a center pole retained inside the yoke and protruding through the through hole of the magnet, a top plate defined with a center opening securely attached on a periphery of the yoke, wherein the center pole protrudes through the center opening of the top plate, a frame mounted on a front surface of the top plate, a cone-shaped diaphragm having a middle through-hole that mounts a bobbin and is enclosed by a cap, wherein the diaphragm has a rim portion attached to a forward end portion of the frame via an edge portion, wherein the bobbin is attached at a middle portion of the diaphragm and extending through the center opening of the top plate, a voice coil mounted around an outer periphery of the bobbin, wherein the improvement comprises:

a waterproof damper adapted to be supported by the frame and defined with a hole adapted to allow extension of the bobbin, the waterproof damper is formed of two layers, wherein a first layer of the two layers is made of a cloth material and a second layer is made of a thin rubber slice, wherein thickness ratio of the first layer to the second layer is about 4:1.

2. A waterproof speaker comprising a yoke inside which a ring-shaped magnet that defines a through hole is retained, a center pole retained inside the yoke and protruding through the through hole of the magnet a top plate defined with a center opening securely attached on a periphery of the yoke, wherein the center pole protrudes through the center opening of the top plate, a frame mounted on a front surface of the top plate, a cone-shaped diaphragm having a middle through-hole that mounts a bobbin and is enclosed by a cap, wherein the diaphragm has a rim portion attached to a forward end portion of the frame via an edge portion, wherein the bobbin is attached at a middle portion of the diaphragm and extending through the center opening of the top plate, a voice coil mounted around an outer periphery of the bobbin, wherein the improvement comprises:

a waterproof damper adapted to be supported by the frame and defined with a hole adapted to allow extension of the bobbin, the waterproof damper is formed of two layers, wherein a first layer of the two layers is made of a cloth material and a second layer is made of a thermoplastic material, wherein thickness ratio of the first layer to the second layer is about 4:1.

* * * * *